(12) United States Patent
Otremba

(10) Patent No.: US 7,936,048 B2
(45) Date of Patent: May 3, 2011

(54) POWER TRANSISTOR AND POWER SEMICONDUCTOR DEVICE

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 1080 days.

(21) Appl. No.: 11/687,041

(22) Filed: Mar. 16, 2007

(65) Prior Publication Data

US 2007/0219033 A1 Sep. 20, 2007

(30) Foreign Application Priority Data

Mar. 17, 2006 (DE) .......................... 10 2006 012 739

(51) Int. Cl.
*H01L 29/40* (2006.01)
*H01L 23/04* (2006.01)
(52) U.S. Cl. .. 257/621; 257/276; 257/698; 257/E23.067
(58) Field of Classification Search .................. 257/621, 257/698, 276, E23.067; 438/667
See application file for complete search history.

(56) References Cited

U.S. PATENT DOCUMENTS

| | | | |
|---|---|---|---|
| 5,122,856 A | 6/1992 | Komiya | 357/55 |
| 5,343,071 A * | 8/1994 | Kazior et al. | 257/621 |
| 5,539,244 A * | 7/1996 | Mori et al. | 257/784 |
| 5,618,752 A | 4/1997 | Gaul | 438/626 |
| 5,683,919 A | 11/1997 | Tserng | 437/31 |
| 6,392,290 B1 | 5/2002 | Kasem et al. | 257/678 |
| 6,404,041 B1 | 6/2002 | Gantioler et al. | 257/666 |
| 6,756,689 B2 | 6/2004 | Nam et al. | 257/783 |
| 7,427,792 B2 * | 9/2008 | Boschlin et al. | 257/302 |
| 7,531,876 B2 * | 5/2009 | Omura et al. | 257/343 |
| 2002/0030260 A1 | 3/2002 | Klingbeil, Jr. | 257/684 |
| 2003/0141571 A1* | 7/2003 | Itoh | 257/621 |
| 2006/0076660 A1 | 4/2006 | Boschlin et al. | 257/678 |

FOREIGN PATENT DOCUMENTS

| | | |
|---|---|---|
| DE | 198 06 817 C1 | 7/1999 |
| DE | 10 2004 021 054 A1 | 11/2005 |
| DE | 10 2004 041 904 A1 | 3/2006 |
| JP | 2001 110986 A | 4/2001 |
| WO | 01/78144 A1 | 10/2001 |

OTHER PUBLICATIONS

German Office Action for German Patent Application No. 10 2006 012 739.0 (4 pages), Oct. 27, 2006.

* cited by examiner

*Primary Examiner* — Shouxiang Hu
(74) *Attorney, Agent, or Firm* — Banner & Witcoff, Ltd.

(57) ABSTRACT

In a power semiconductor device, the vertically conducting power transistor has at its front side (11) a source zone (14) and a control input (16). A feedthrough for the control input has an electrode on the front side (11) and an electrode on the rear side (12), with the result that contact can be made with the control input both from the front side (11) and from the rear side (12).

19 Claims, 2 Drawing Sheets

POWER TRANSISTOR AND POWER SEMICONDUCTOR DEVICE

RELATED APPLICATION

This application claims priority from German Patent Application No. DE 10 2006 012 739.0, which was filed on Mar. 17, 2006, and is incorporated herein by reference in its entirety.

TECHNICAL FIELD

The invention relates to a power transistor and power semiconductor device.

BACKGROUND

In present-day power transistors, e.g. IGBTs and power MOSFETs, which are constructed as vertical power transistors and are implemented in a chip, the current flow is effected vertically through the chip. The chip has a semiconductor body delimited by a front side, a rear side, and four lateral edges. A first highly doped semiconductor zone of a first connection of the load path, e.g. a source zone or an emitter zone, is provided in the semiconductor body at the front side. A highly doped second semiconductor zone for a second connection of the load path, e.g. a drain or a collector, is provided in the semiconductor body at the rear side.

A control input, e.g. a gate or a base, is provided at the front side. The application of a voltage to the control input effects a current flow from the second to the first semiconductor zone if the voltage falls below or exceeds a specific threshold value.

If the rear side of the power transistor is connected to a chip carrier, the chip carrier acts as a capacitance at the drain or at the collector, which leads to large power losses and to high emissions upon changeover of the drain potential or the collector potential.

DE 198 06 817 discloses providing a feedthrough through a chip. Through said feedthrough, the connection for a gate is led from the front side to the rear side in order to make contact with the gate on the rear side. However, such a power transistor is only suitable for specific applications and, in particular, is poorly stackable.

SUMMARY

According to an embodiment, a power transistor, may comprise a semiconductor body delimited by a front side, a rear side and four lateral edges, a first highly doped semiconductor zone of a first connection of the load path at the front side of the semiconductor body, a control input at the front side, the application of a voltage to the control input effecting a current flow between the second semiconductor zone and the first semiconductor zone, and at least one feedthrough from the front side to the rear side through the semiconductor body, a conductive connection being led from the control input to the rear side through the feedthrough and having metallic electrodes on the front side and on the rear side.

BRIEF DESCRIPTION OF THE DRAWINGS

The invention is illustrated in more detail in the drawings on the basis of exemplary embodiments.

DETAILED DESCRIPTION

Figure 1:
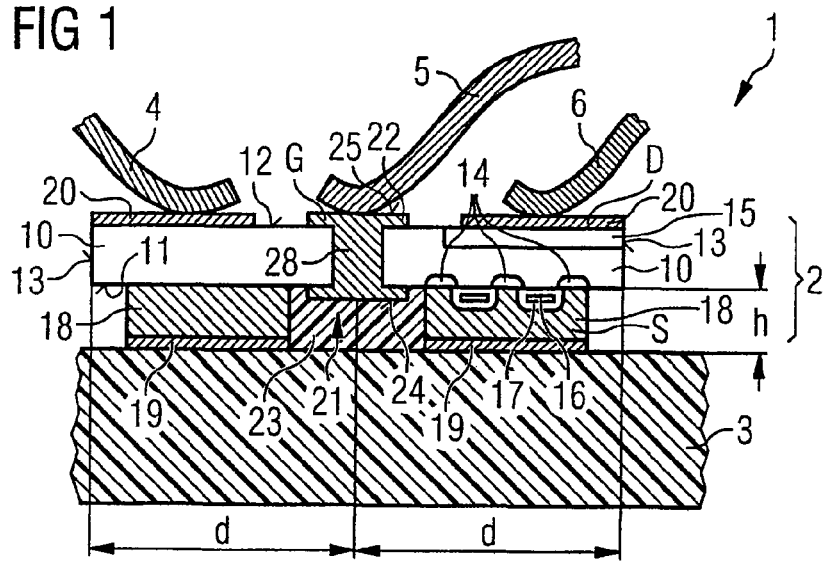
FIG. 1 shows a power semiconductor device with a power transistor according to an embodiment in cross section.

According to an embodiment, a power transistor may comprise a semiconductor body. The semiconductor body can be delimited by a front side, a rear side and four lateral edges. A first highly doped semiconductor zone of a first connection of the load path can be provided at the front side of the semiconductor body. The first highly doped semiconductor zone can be, e.g., a source zone or an emitter zone. According to an embodiment, the load path can be the path between a source and a drain or the path between an emitter and a collector.

By contrast, a highly doped semiconductor zone of a second connection of the load path can be provided at the rear side of the semiconductor body, according to an embodiment. The second semiconductor zone can be, e.g., a drain or an emitter, according to an embodiment. In addition, according to an embodiment, a control input fashioned e.g. as a gate or as a base is situated at the front side. Application of a voltage to the control input effects a current flow between the second and the first semiconductor zone if the voltage falls below or exceeds a threshold value. In the case where the threshold value is not exceeded or undershot, by contrast, a current flow is prevented.

In addition, according to an embodiment, the power transistor may have a feedthrough through the semiconductor body from the front side to the rear side. Through the feedthrough, a conductive connection is led from the control input, which, as specified above, is situated on the front side, to the rear side.

According to an embodiment, the feedthrough in each case has an electrode for the connection of the control input both on the front side and on the rear side.

According to an embodiment, contact can advantageously be made with the power transistor from both sides. The power transistor can be mounted both with its front side downward and with its front side upward and subsequently be connected from above since contact can be made with the control input from both sides. Consequently, in multichip modules in which a power transistor is provided with the front side downward and a power transistor is provided with the front side upward, it is possible to use the same type of power transistor, according to an embodiment.

The power transistor according to an embodiment is particularly suitable for chip stacks in which a plurality of power transistors are arranged one above another. In that case it is appropriate for the control inputs of the power transistors lying one above another to be connected to one another. In this case, the control input of the power transistor lying at the top is connected from above to a bonding wire and is connected from below to the control input of the power transistor lying at the bottom.

According to an embodiment, the distances between the feedthroughs and opposite lateral edges preferably differ by less than 10%. Consequently, the feedthrough lies in the center of the chip and enables a vertical connection between power transistors lying one above another. Lateral rewirings for the connection between the control inputs are avoided in this case.

A further advantage is afforded by virtue of the fact that a bonding wire which makes contact with the control input from above is led into the center of the power transistor, according to an embodiment. This increases the mechanical stability in comparison with arrangements in which the bonding wire for the control input is arranged at the edge of the power transistor.

In a further embodiment, the power transistor may comprise a second feedthrough from the front side to the rear side of the semiconductor body, provision likewise being made of a conductive connection from the control input to the rear side and in each case an electrode on the front side and an electrode on the rear side. According to an embodiment, the two feedthroughs are provided symmetrically with respect to a center axis of the power transistor. The center axes result from in each case identical distances from mutually opposite lateral edges.

The symmetrical arrangement of the electrodes of the feedthroughs ensures that the latter lie one above another, for the case where two power transistors lie one above another and one of the power transistors is rotated in such a way that the front side of one of the power transistor lies opposite the rear side of the other power transistor. As a result, the connection between the control inputs of the power transistors lying one above another can advantageously be embodied in vertical fashion.

If the first semiconductor zone is a source zone, the second semiconductor zone is a drain zone and the control input is a gate, the power transistor forms a power MOSFET, according to an embodiment.

By contrast, if the first semiconductor zone is a collector zone, the second semiconductor zone is an emitter zone and the control input is a gate, an IGBT is involved, according to an embodiment.

According to an embodiment, a metallization containing two regions that are electrically insulated from one another can be provided on the rear side of the power transistor. According to an embodiment, the first region can be at the potential of the second connection of the load path and the second region can be electrically connected to the control input of the power transistor. The structuring of the rear side metallization makes it possible for bonding wires which are at two different potentials in the application to be fitted on the rear side of the power transistor.

If the power transistor according to an embodiment is applied on a chip carrier in such a way that the power semiconductor body points downward with its front side, an electrical connection between the chip carrier and the first semiconductor zone is preferably realized via a metal layer on the front side. In this case, the metal layer forms a contact area. Via said metal layer, the chip carrier is electrically connected to the first semiconductor zone in a manner exhibiting the lowest possible resistance, according to an embodiment. In this case, the chip carrier is advantageously at the source or emitter potential. According to an embodiment, as a result, in the application, the chip carrier can be connected to the ground potential. Since the ground potential remains essentially unchanged, the capacitance of the chip carrier does not lead to power losses and does not lead to electromagnetic emissions, as is the case e.g. with an n-channel transistor whose drain is connected to a chip carrier.

According to an embodiment, the chip carrier may be connected to a heat sink without further electrical insulation being necessary. Such insulation would be necessary if the chip carrier were at a different potential than the ground potential.

If the connection between the chip carrier and the metal layer is effected via a diffusion soldering connection, according to an embodiment, the latter can be realized with a small structural height. Moreover, a diffusion soldering connection can be particularly thermostable since its melting point lies above the soldering temperature, according to an embodiment.

If a mold composition is provided between the chip carrier and the feedthrough, it serves for electrical insulation between the chip carrier, which is at the ground potential, and the conductive connection of the feedthrough, which carries the potential of the control input. The distance is preferably at least as great as the quotient of U and the insulation strength of the mold composition, where U is equal to the maximum voltage to be assumed between the first semiconductor zone and the control input. In order to comply with the distance, the contact area of the first semiconductor zone must be thick enough to guarantee the breakdown strength, according to an embodiment.

According to an embodiment, a power semiconductor device may have at least two chips, at least one of which has a power transistor. According to an embodiment, such a power semiconductor device may contain, e.g., a power MOSFET and also a freewheeling diode. In another embodiment, the first chip contains a drive circuit for the power transistor integrated in the second chip.

If two power transistors according to an embodiment are arranged one above another, the feedthroughs of the two power transistors are preferably provided vertically one above another, according to an embodiment. A vertical rewiring layer for connecting the control inputs is obviated as a result.

Preferably, according to an embodiment, the first semiconductor zone of the power transistor is opposite the second semiconductor zone of the second power transistor. This enables a parallel connection of the power transistors lying one above another with a simple connection between the control inputs.

According to an embodiment, in a method for producing a power semiconductor device having two power transistors, the power transistors in each case have at least one feedthrough through the semiconductor body and electrodes for the control input on the front side and rear side. The first power transistor is applied with its rear side pointing downward on a chip carrier. The second power transistor is applied on the first power transistor in such a way that the control inputs of the first power transistor and of the second power transistor are connected to one another.

According to an embodiment, the method enables power transistors that are connected in parallel to be stacked one above another, which is necessary if the space in the vertical direction is limited.

Preferably, according to an embodiment, the power transistors are stacked one on top of another in such a way that the electrode for the control input on the rear side of the first power transistor is connected to the electrode for the control input on the front side of the second power transistor via a vertical connection. According to an embodiment, a purely vertical connection is simpler to produce than a connection which runs both vertically and horizontally.

According to an embodiment, the control inputs are preferably connected by means of a bonding wire on the rear side of the second power transistor. This enables the control inputs of the two power transistors to be connected via a single bonding wire.

FIG. 1 shows a detail from a power semiconductor device according to an embodiment in cross section. The power semiconductor device 1 according to an embodiment contains a power transistor 2, which is applied on a chip carrier 3 and which is connected by means of the bonding wires 4, 5 and 6.

The power transistor 2 contains a semiconductor body 10 delimited by a front side 11 pointing downward, a rear side 12 pointing upward and by lateral edges 13. A multiplicity of highly doped first semiconductor zones 14 are provided at the front side 11, while a highly doped second semiconductor zone 15 is provided on the rear side 12. The highly doped semiconductor zones 14 and 15 are formed as $n^+$-doped semiconductor zones in this case. The semiconductor body 10 furthermore contains a p-doped semiconductor zone (not shown in the figure) in which a channel is formed when the transistor is switched on. In addition, the power transistor 2 contains an n-doped drift zone (not shown here) between the second semiconductor zone and the p-doped semiconductor zone.

Gates 16 that form a control input for the power transistor 2 are situated below the front side 11. The gates 16 are electrically insulated from the semiconductor body 10 by means of the insulation 17.

When a voltage is applied to the gates 16, if the voltage exceeds a specific threshold value, a current flow occurs between the first semiconductor zones 14, which in this case are source zones, to the second semiconductor zone 15, which is formed as a drain zone 15.

The first semiconductor zones 14, the second semiconductor zone 15 and the gates 16 are only depicted on the right-hand side of the power semiconductor device 1 in the figure, but they are present on the left-hand side, too.

The power transistor 2 shown is formed as a power MOSFET. In a modification of FIG. 1, it could also be formed as an IGBT, the first semiconductor zone 14 forming a collector and the second semiconductor zone 15 forming an emitter. The load path of the power transistor is the path between first semiconductor zone 14 and second semiconductor zone 15, the first connection of the load path being formed by the source or the emitter and the second connection of the load path being formed by the drain or by the collector.

In addition, first contact areas 18 composed of a metal are provided on the front side 11, said contact areas serving for electrically connecting the first semiconductor zone 14. Said first contact areas 18 are applied on a metallic chip carrier 13 by means of a diffusion soldering connection 19. Consequently, there is an electrical connection between the first semiconductor zones 14 and the chip carrier 3.

A diffusion solder process is proposed for applying the power transistor 2 on the chip carrier 3, the diffusion solder (e.g. Sn, AgSn, AuSn, CuSn, InAg, . . . ) being deposited onto the first contact areas 18 forming the chip front side metallization. In this case, the diffusion solder is deposited e.g. by sputtering, vapor deposition or electrodeposition. The chip front side metallization is subsequently pressed onto the chip carrier 3, which is heated to 200° C. to 400° C., in flip-chip mounting, that is to say with the front side downward.

On the rear side 12 of the power transistor 2, second contact areas 20 composed of metal are applied in electrical contact with the second semiconductor zone 15. Bonding wires 4 and 6 are fitted on the second contact areas 20, said bonding wires serving for electrically connecting external contacts to the second semiconductor zone 15.

A feedthrough 21 through the semiconductor body 10 is situated in the center of the power transistor 10. The feedthrough 21 is filled with an electrically conductive metallic material 22 and is in electrical contact with the gates 16. The electrically conductive metallic material 22 forms an electrical connection 28 for the control input from the front side to the rear side. The bonding wire 15 is applied on the electrically conductive material 22 of the feedthrough 21, with the result that it is in electrical contact with the gates 16.

The feedthrough 21 can be produced by means of an etching process, for example. The electrically conductive material 22 is isolated from the adjacent regions of the semiconductor body 10 by means of an insulation (not shown here), for example composed of silicon oxide. Through the electrically conductive material 22, an electrode 24 is provided on the front side 11 and an electrode 25 is also provided on the rear side 12. The electrodes 24 and 25 serve for the connection of the control input.

The gates 16 can therefore be bonded from the chip rear side. An insulation 23 composed of a mold composition, e.g. composed of a resin, is accommodated between the electrically conductive material 22 and the chip carrier 3. Said mold composition is intended to increase the insulation strength between the chip carrier 3 and the feedthrough 21.

The height of the insulation 23 is fixed at at least 40 μm since the mold composition has an insulation strength of 50 V/μm and the desired insulation strength is 2000 V. It is important that the insulation 23 is not provided during the production of the power transistor 2 in the front end, which involves the production of the semiconductor body 2 and the contact areas 18 and 20 situated thereon. After the front end, the electrode 24 must be freely accessible in order that in the back end there is a choice as to whether the gates are connected from the front side 11, from the rear side 12 or from both sides.

The distance between the feedthrough 21 and the left-hand lateral edge 13 is equal in magnitude to the distance between the feedthrough 21 and the right-hand lateral edge 13. These distances are designated by d. Consequently, the feedthrough lies in the center. If two power transistors are stacked one above another, the feedthroughs therefore lie one above another.

Figure 2:
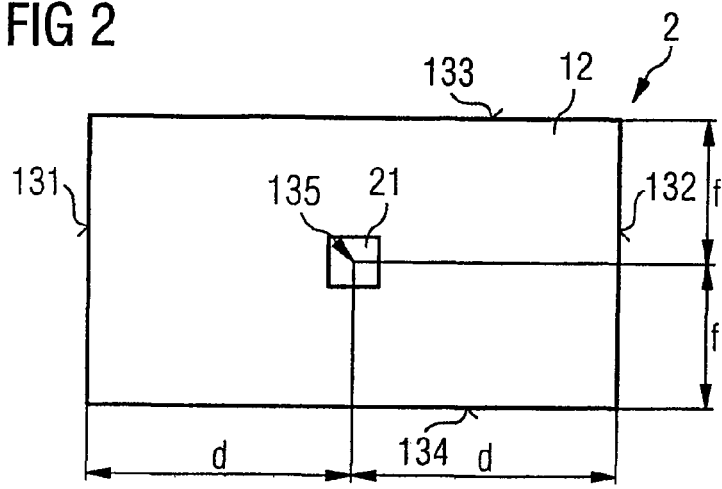
FIG. 2 shows an embodiment of the power transistor in plan view.

FIG. 2 shows the power transistor 2 according to an embodiment in plan view. The power transistor 2 is delimited by the lateral edges 131, 132, 133 and 134. The lateral edges 131 and 132 are opposite one another, in the same way as the lateral edges 133 and 134 are opposite one another. The distances between the center of the rear side 135 of the feedthrough 21 and the lateral edges 131 and 132 are in each case d, while the distances between the vertical center of the rear side 135 and the lateral edges 133 and 134 are in each case f. The feedthrough 21 thus covers the center of the rear side 135, whereby the mechanical stability of the power semiconductor device 1 is improved, especially as the bonding wire for the gate 5 is fitted symmetrically in the center of the power transistor 2.

Figure 3:
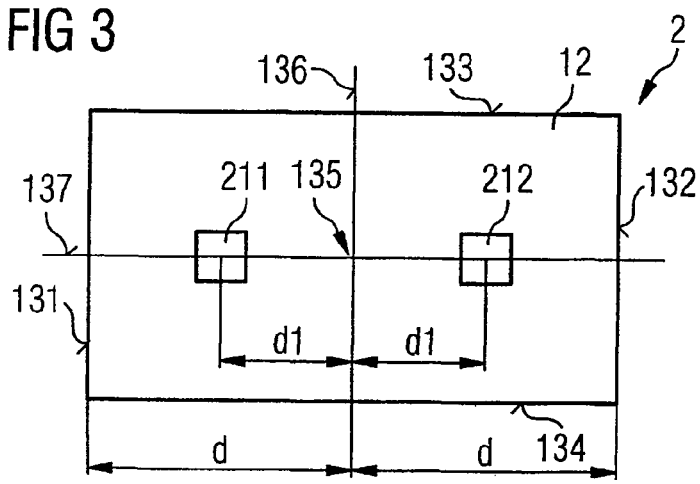
FIG. 3 shows a further embodiment of the power transistor in plan view.

FIG. 3 shows a further exemplary embodiment of a power transistor 2 according to an embodiment in plan view. The power transistor 2 contains a left-hand feedthrough 211 and right-hand feedthrough 212. The axes 136 and 137 indicate the centers between the lateral edges 131 and 132, and 133 and 134, respectively. The two feedthroughs 211 and 212 are in each case at a distance d1 from the center axis 136 and are axially symmetrical to one another with regard to the center axis 136.

If two power transistors 2 are stacked one above another and one of the two power transistors 2 is rotated about the axis 136, the feedthrough 212 of the first power transistor lies on the feedthrough 211 of the second power transistor and the feedthrough 211 of the first power transistor lies on the feedthrough 212 of the second power transistor. Consequently, the control inputs of the power transistors can be connected to one another via vertical connections.

Figure 4:
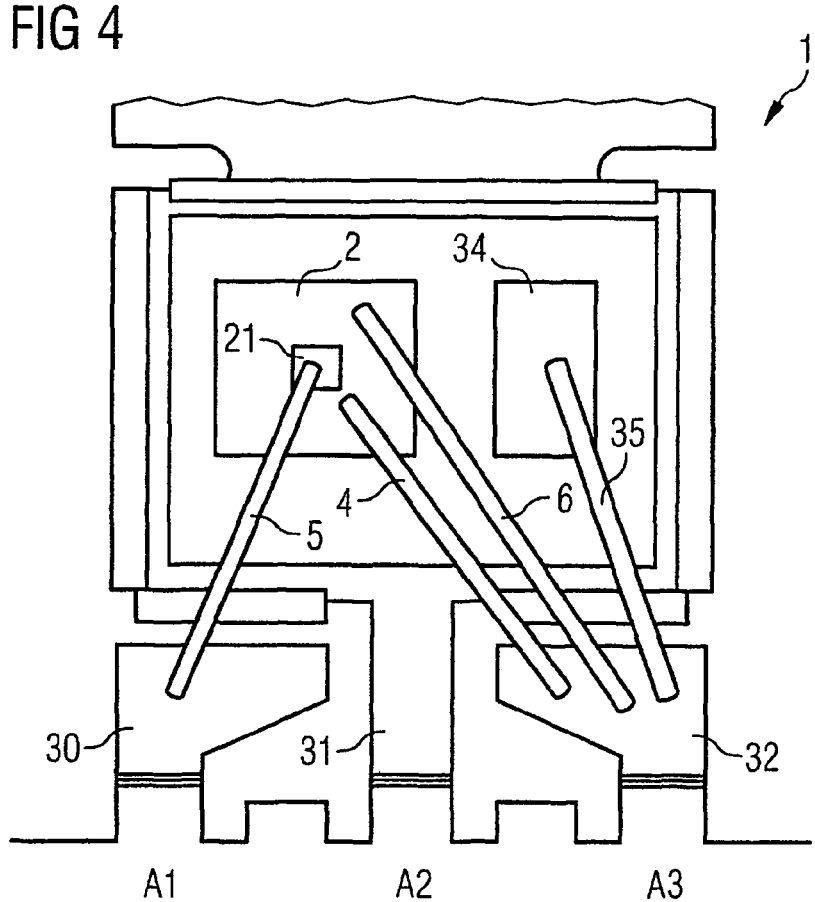
FIG. 4 shows an embodiment of a power semiconductor device in plan view.

FIG. 4 illustrates, in plan view, a power semiconductor device according to an embodiment which contains two chips. The power semiconductor device 1 according to an embodiment contains a leadframe having a first lead 30, a second lead 31 and a third lead 32. A power transistor 2 and a diode 34 are applied on the second lead 32. Elements having the same functions as in the previous figures are provided with the same reference symbols and are not explained separately.

The power transistor 2 is applied with its front side 11 downward as in FIG. 1, with the result that its rear side 12 points upward. On the top side 12, the gate is connected to a bonding wire 5 via the feedthrough 21. The bonding wire 5 is additionally connected to the first lead 30. The bonding wires 4 and 6 connect the third lead 32 to the drain.

The second lead 31 is conductively connected to the source potential. The source potential is at the ground potential and is therefore temporally stable. During the switching of the power transistor 2, no capacitance need be subjected to charge reversal, which lowers the current consumption and avoids high-frequency emissions.

Furthermore, a vertically conducting diode 34 is applied on the second lead 31. The anode connection is situated on the underside of the diode 34 and is in electrical contact with the second lead 31. The cathode is situated on the top side of the diode 34 and is connected to third lead 32 via a further bonding wire 35.

Consequently, the power transistor according to an embodiment is also suitable for multichip modules comprising a power MOSFET and a freewheeling diode connected in parallel therewith, which may also be referred to as DuoPack. Multi chip module is understood to mean a semiconductor device containing a plurality of chips which are accommodated jointly in a semiconductor housing. The power transistor is also suitable for a combination of a power MOSFET with a control IC in a housing, which is also referred to as CoolSet.

The power MOSFET described with a feedthrough for the gate is also suitable for multichip mounting arrangements in which the chip carrier is potential-free and can be used for cooling without further electrical insulation.

Figure 5:
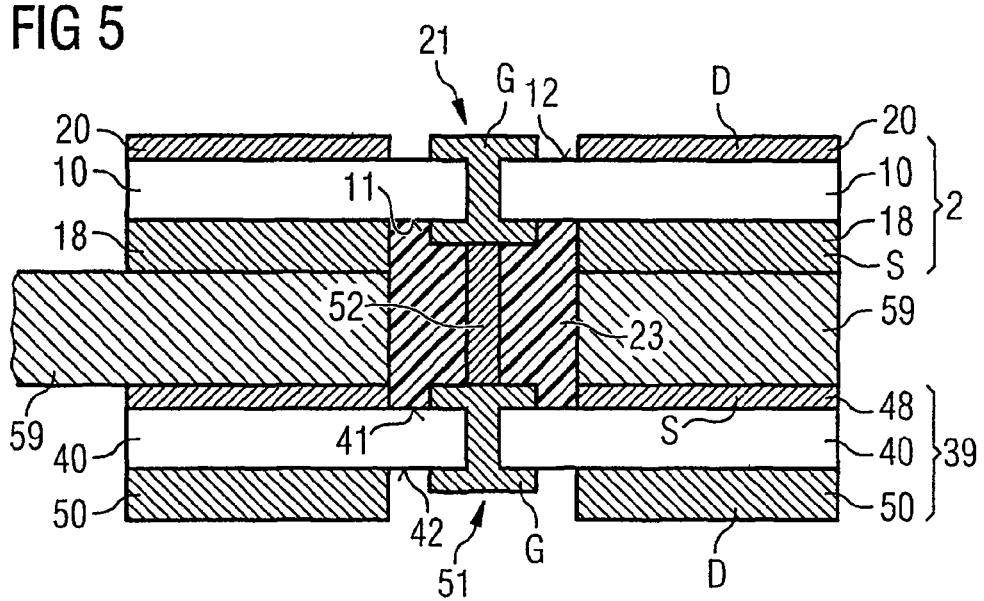
FIG. 5 shows a power semiconductor device according to an embodiment with two power transistors arranged one above another, in cross section.

FIG. 5 illustrates a power semiconductor device having a first power transistor 2 and a second power transistor 39. The two power transistors 10 and 39 are formed in each case like the power transistor 2 in FIG. 1 with first semiconductor zones 14, a second semiconductor zone 15 and gates 16. The power transistor 39 bears on a chip carrier (not shown here). In this case, the power transistor 39 is oriented in such a way that its drain points downward and its source points upward. A metallic interlayer 59 bears on the contact area 48 and projects outward on the left-hand side. The contact area 48 is electrically connected externally via said interlayer 59. A vertical connecting line 52 is provided on the feedthrough 51 of the power transistor 39, the feedthrough 21 of the first power transistor 2 being connected via said connecting line.

Contact is made with the feedthrough 21 from the rear side 12 by means of a bonding wire (not shown here). The feedthrough 21 is therefore connected both to the electrode at the rear side 12 and to the electrode at the front side 11.

The provision of the feedthroughs 21 and 51 in the center of the power transistors means that only a vertical connection of the feedthroughs is required, which is significantly simpler to produce compared with lateral connections.

During the production of the power semiconductor device, firstly the power transistor 39 is applied on a chip carrier, the chip carrier being connected to the contact area 50 and being isolated from the electrically conductive material of the feedthrough 51. This is followed by the application of the interlayer 59 and the vertically running connection 52 on the first power transistor 39 before the power transistor 2 is applied thereto.

LIST OF REFERENCE SYMBOLS

1 Power semiconductor device
2 Power transistor
3 Chip carrier
4 Bonding wire
5 Bonding wire
6 Bonding wire
10 Semiconductor body
11 Front side
12 Rear side
13 Lateral edge
131,132,133,134 Lateral edge
135 Center of the rear side
136 Center axis
14 First semiconductor zone
15 Second semiconductor zone
16 Control input
17 Insulation
18 First contact area
19 Diffusion soldering connection
20 Second contact area
21 Feedthrough
211 Feedthrough
212 Feedthrough
22 Electrically conductive material
23 Insulation
24 Electrode
25 Electrode
28 Conductive connection
30 First lead
31 Second lead
32 Third lead
34 Diode
35 Bonding wire
39 Power transistor
40 Semiconductor body
41 Front side
42 Rear side
48 Contact area
50 Contact area
52 Vertical conductive connection
59 Interlayer

What is claimed is:
1. A power transistor, comprising:
a semiconductor body having a front side and an opposite rear side,
a first highly doped semiconductor zone of a first connection of a load path of the power transistor at the front side of the semiconductor body,
a second highly doped semiconductor zone of a second connection of the load path at the rear side of the semiconductor body,
a control input at the front side and configured such that a voltage applied to the control input would cause a current flow between the second semiconductor zone and the first semiconductor zone, and
a first feedthrough from the front side to the rear side through the semiconductor body and conductively con- necting the control input to the rear side, the feedthrough having metallic electrodes on the front and rear sides of the semiconductor body, wherein the semiconductor body is disposed with its front side facing toward a chip carrier, the chip carrier is electrically connected to the first semiconductor zone via a metal layer on the front side of the semiconductor body, a mold composition is disposed between the chip carrier and the first feedthrough, and a distance between the chip carrier and the first feedthrough is at least as great as a quotient of U and an insulation strength of the mold composition, where U is equal to a maximum voltage to be provided between the first semiconductor zone and the control input.

2. The power transistor according to claim 1, wherein the semiconductor body further has four lateral edges, and wherein the first feedthrough covers a center of the rear side of the semiconductor body, the center being identical distances from mutually opposite ones of the lateral edges.

3. The power transistor according to claim 1, wherein the semiconductor body further has four lateral edges, the power transistor further comprising a second feedthrough, the first and second feedthroughs being symmetrical to one another with regard to a center axis of the power transistor, the center axis being identical distances from mutually opposite ones of the lateral edges.

4. The power transistor according to claim 1, wherein the first semiconductor zone is a source zone, the second semiconductor zone is a drain zone and the control input is a gate.

5. The power transistor according to claim 1, wherein the first semiconductor zone is a collector zone, the second semiconductor zone is an emitter zone and the control input is a gate.

6. The power transistor according to claim 1, further comprising a metallization having first and second regions disposed on the rear side of the semiconductor body, the first region being at a potential of the second connection of the load path and the second region being electrically connected to the control input.

7. The power transistor according to claim 1, wherein the front side of the semiconductor body has a metallization that comprises a diffusion soldering connection on the chip carrier.

8. The power transistor according to claim 1, further comprising a bonding wire which makes contact with the first feedthrough at the rear side of the semiconductor body and forms a connection for the control input.

9. A power semiconductor device containing a first chip, the first chip comprising a first power transistor, the first power transistor comprising:

a first semiconductor body having a first side and a second side opposite the first side, a first highly doped semiconductor zone of a load path of the first power transistor disposed at the first side of the first semiconductor body, a second highly doped semiconductor zone of the load path of the first power transistor disposed at the second side of the first semiconductor body, a first control input at the first side of the first semiconductor body and configured such that a voltage applied to the first control input would cause a current flow between the second and first semiconductor zones of the first power transistor, and a first conductive element extending from the first side to the second side through the first semiconductor body and electrically connecting the first control input to the second side, the first conductive element having metallic electrodes on the first side and on the second side, wherein the first semiconductor body is disposed with its first side facing toward a chip carrier, the chip carrier is electrically connected to the first semiconductor zone via a metal layer on the first side of the first semiconductor body, a mold composition is disposed between the chip carrier and the first conductive element, and a distance between the chip carrier and the first conductive element is at least as great as a quotient of U and an insulation strength of the mold composition, where U is equal to a maximum voltage to be provided between the first semiconductor zone and the first control input.

10. The power semiconductor device according to claim 9, further comprising a second chip that comprises a diode.

11. The power semiconductor device according to claim 9, further comprising a second chip that comprises a driving circuit for the first power transistor.

12. The power semiconductor device according to claim 9, further comprising a second power transistor, the second power transistor comprising:

a second semiconductor body having a first side and a second side opposite the first side of the second semiconductor body, a first highly doped semiconductor zone of a load path of the second power transistor disposed at the first side of the second semiconductor body, a second highly doped semiconductor zone of the load path of the second power transistor disposed at the second side of the second semiconductor body, a second control input at the first side of the second semiconductor body and configured such that a voltage applied to the second control input would cause a current flow between the second and first semiconductor zones of the second power transistor, and a second conductive element extending from the first side to the second side through the second semiconductor body and electrically connecting the second control input to the second side of the second semiconductor body, the second conductive element having metallic electrodes on the first side and second sides of the second semiconductor body, wherein the first and second power transistors are arranged one above another in such a way that the first and second conductive elements of the first and second power transistors lie one above another and the electrodes of the first and second control inputs are electrically connected to one another by means of a vertically running connection.

13. The power semiconductor device according to claim 12, wherein the first and second power transistors are arranged in such a way that the first semiconductor zone of the first power transistor is opposite the first semiconductor zone of the second power transistor.

14. The power semiconductor device according to claim 9, wherein the first semiconductor body further has four lateral edges, and wherein the first conductive element covers a center of the second side of the first semiconductor body, the center being identical distances from mutually opposite ones of the lateral edges.

15. The power semiconductor device according to claim 9, wherein the first semiconductor zone is a source zone, the second semiconductor zone is a drain zone, and the first control input is a gate.

16. The power semiconductor device according to claim 9, wherein the first semiconductor zone is a collector zone, the second semiconductor zone is an emitter zone, and the first control input is a gate.

17. The power semiconductor device according to claim 9, further comprising a metallization having first and second regions disposed on the second side of the first semiconductor body, the first region being at a potential of a second connection of the load path and the second region being electrically connected to the first control input.

18. The power semiconductor device according to claim 9, wherein the first side of the first semiconductor body has a metallization that comprises a diffusion soldering connection on the chip carrier.

19. The power semiconductor device according to claim 9, further comprising a bonding wire which makes contact with the first conductive element at the second side of the first semiconductor body and forms a connection for the first control input.

* * * * *